United States Patent
Shichi et al.

(10) Patent No.: US 7,368,729 B2
(45) Date of Patent: May 6, 2008

(54) METHOD, APPARATUS AND SYSTEM FOR SPECIMEN FABRICATION BY USING AN ION BEAM

(75) Inventors: Hiroyasu Shichi, Tokyo (JP); Kaoru Umemura, Tokyo (JP); Muneyuki Fukuda, Kokubunji (JP)

(73) Assignee: Hitachi High-Technologies Corp., Tokyo (JP)

( * ) Notice: Subject to any disclaimer, the term of this patent is extended or adjusted under 35 U.S.C. 154(b) by 0 days.

(21) Appl. No.: 11/480,975

(22) Filed: Jul. 6, 2006

(65) Prior Publication Data
US 2006/0249697 A1    Nov. 9, 2006

Related U.S. Application Data

(63) Continuation of application No. 10/859,365, filed on Jun. 3, 2004, now Pat. No. 7,095,021.

(30) Foreign Application Priority Data
Jun. 19, 2003    (JP) .............................. 2003-174412

(51) Int. Cl.
*H01J 37/20* (2006.01)
*G01N 23/225* (2006.01)

(52) U.S. Cl. ................. 250/442.11; 250/307; 250/309; 250/492.21

(58) Field of Classification Search .......... 250/492.21, 250/423 R, 309, 307, 442.11; 315/111.41, 315/111.81
See application file for complete search history.

(56) References Cited

U.S. PATENT DOCUMENTS

| | | | | |
|---|---|---|---|---|
| 3,916,034 A | * | 10/1975 | Tsuchimoto | ................ 427/571 |
| 5,055,696 A | * | 10/1991 | Haraichi et al. | ......... 250/492.2 |
| 5,504,340 A | * | 4/1996 | Mizumura et al. | ..... 250/492.21 |
| 5,574,280 A | * | 11/1996 | Fujii et al. | .................. 250/309 |
| 5,583,344 A | * | 12/1996 | Mizumura et al. | ..... 250/492.21 |
| 5,825,035 A | * | 10/1998 | Mizumura et al. | ...... 250/423 R |
| 6,268,608 B1 | * | 7/2001 | Chandler | ................. 250/492.2 |
| 6,303,932 B1 | * | 10/2001 | Hamamura et al. | ......... 250/309 |

(Continued)

FOREIGN PATENT DOCUMENTS

JP    5-52721    3/1993

(Continued)

*Primary Examiner*—Nikita Wells
*Assistant Examiner*—Johnnie L Smith, II
(74) *Attorney, Agent, or Firm*—Mattingly, Stanger, Malur & Brundidge, PC

(57) ABSTRACT

A method and system for separating and preparing a sample for analysis from a wafer without contaminating the wafer with an element such as Ga. A first ion beam is irradiated on a sample and scanned to fabricate a micro sample from a part of the sample. A probe for separating the micro sample from the sample and a micro-sample stage on which the micro sample is to be placed and held are provided. The first ion beam contains at least one of an inert gas, oxygen and nitrogen as an element. A second ion beam contains an element different from the element of the first ion beam. The separated micro sample is fed to the second ion beam from the apparatus of the first ion beam while being held on the micro-sample stage, and is processed by using the second ion beam.

13 Claims, 15 Drawing Sheets

U.S. PATENT DOCUMENTS

| | | | |
|---|---|---|---|
| 6,414,307 B1 * | 7/2002 | Gerlach et al. | 250/309 |
| 6,538,254 B1 * | 3/2003 | Tomimatsu et al. | 250/442.11 |
| 6,828,566 B2 * | 12/2004 | Tomimatsu et al. | 250/442.11 |
| 7,138,629 B2 * | 11/2006 | Noji et al. | 250/311 |
| 2003/0183776 A1 * | 10/2003 | Tomimatsu et al. | 250/442.11 |
| 2003/0198755 A1 * | 10/2003 | Shichi et al. | 427/596 |
| 2005/0190450 A1 * | 9/2005 | Becker et al. | 359/601 |
| 2006/0113488 A1 * | 6/2006 | Motoi | 250/492.21 |

FOREIGN PATENT DOCUMENTS

| | | |
|---|---|---|
| JP | 7-320670 | 12/1995 |
| JP | 2000-156393 | 6/2000 |
| JP | 2001-345360 | 12/2001 |
| JP | 2002-148159 | 5/2002 |
| JP | 2002-150990 | 5/2002 |
| JP | 2003-22776 | 1/2003 |
| JP | 2003-311435 | 11/2003 |
| JP | 2004-31549 | 1/2004 |
| JP | 6-260129 | 9/2004 |
| JP | 2004-328003 | 11/2004 |

* cited by examiner

A A' SECTION

A A' SECTION

A A' SECTION

A A' SECTION

A A' SECTION

A A' SECTION

A A' SECTION

A A' SECTION

METHOD, APPARATUS AND SYSTEM FOR SPECIMEN FABRICATION BY USING AN ION BEAM

This is a continuation application of U.S. Ser. No. 10/859,365, filed Jun. 3, 2004 now U.S. Pat. No. 7,095,021.

CLAIM OF PRIORITY

The present invention claims priority from Japanese application JP 2003-174412 filed on Jun. 19, 2003, the content of which is hereby incorporated by reference on to this application.

BACKGROUND OF THE INVENTION

The present invention relates to a technology of inspecting and analyzing electronics, such as semiconductor devices.

A high-yield fabrication is demanded in manufacturing electronics, such as semiconductor devices like a semiconductor memory, typified by a dynamic random access memory, a microprocessor and a semiconductor laser, and a magnetic head.

Reduction in production yield caused by the occurrence of defective products lowers the profit. It is therefore an important issue to find defects, foreign matter and inadequate processing, which would bring about defective products, earlier and take an early countermeasure against such defects. For example, in the field of manufacturing electronics, attention is paid to detection of defective products by thorough inspection and analysis of causes for the defective products. In the actual electronics fabrication process using substrates, substrates after completion are inspected to investigate the locations of abnormality such as defects or foreign matter in a circuit pattern and consider a countermeasure against such defects.

Normally, a high resolution scanning electron microscope (hereinafter referred to as "SEM") is used in observing the micro structures of samples. As the integration scale of semiconductor devices becomes greater, it becomes difficult to observe targets with the resolution of the SEM, so that a transmission electron microscope transmission electron microscope (hereinafter referred to as "TEM") having a high observation resolution is used in place of the SEM.

Recently has been used a processing method which applies the action of particles constituting a sample to be discharged out of the sample when a focused ion beam (hereinafter referred to as "FIB") onto the sample, i.e., FIB processing. Particularly, the use of FIB can ensure fabrication of a TEM sample without segmenting a wafer (see Japanese Patent Laid-Open Publication No. H5 (1993)-52721, for example). As shown in FIG. 2, the method carries out processes, such as the formation of a rectangular hole 101, a bottom hole 102, a trench 103, etc. by irradiation of an FIB 1, connection using an ion beam assist deposition layer 4 (hereinafter called "deposition layer 4") and transfer of a micro sample 6 by means of a probe 3. As the micro sample is processed into a membrane by the FIB 1, it becomes a TEM sample. This scheme is called a micro-sampling method or pickup method.

A membrane 202 is formed on a wafer 201 as shown in FIG. 3A, and the periphery of the sample membrane is cut away, partly left, with the FIB 1 and a sample membrane 203 is separated from the wafer 201, as shown in FIG. 3B. Then, the wafer 201 is removed from the ion beam process system and the sample membrane 203 is completely separated from the wafer 201 in the air using the static electricity generated from a glass rod and is moved onto a TEM sample holder 204. This method can also ensure observation of a separated sample membrane with a TEM. This method is called a lift-out method.

There is also proposed a scheme of taking out a micro sample from a sample without segmenting a wafer using the sample segmentation method and returning the wafer to the next process (e.g., Japanese Patent Laid-Open Publication No. 2000-156393). This publication discloses a method which includes a step of extracting a part of a sample without segmenting a sample and preparing a TEM sample at the end of the fabrication process in the method of fabricating electronics by performing a plurality of processes on the sample, and monitoring or inspecting and analyzing the progress in the fabrication process. This method prevents semiconductor devices from being lost by the segmentation of a wafer and can thus reduce the total manufacturing cost of semiconductor devices.

Because the method uses an FIB containing gallium (Ga) as ions at the time of separating a micro sample, Ga constituting the FIB remains in the process area from which the micro sample has been removed. The presence of Ga is very likely to cause defective products in the fabrication of semiconductor devices. Particularly, as Ga is a p-type impurity with respect to an Si-semiconductor, the problem is more crucial. If a wafer is returned to the next process with contamination of Ga remaining, the pollutant Ga diffuses and permeates a semiconductor element which has undergone the fabrication process properly, causing improper electric characteristics or improper contact. As a solution to this problem, a wafer from which a micro sample is extracted may be subjected to cleaning using a chemical. This scheme however involves multiple steps, which would raise the manufacturing cost. Further, when the FIB is irradiated at the acceleration of 30 kv, for example, the FIB enters the sample to the depth of about 10 nm from the surface, so that surface cleaning alone cannot completely remove contamination containing an ion beam element buried in the sample.

A countermeasure against Ga contamination is proposed (see Japanese Patent Laid-Open Publication No. H6 (1994)-260129, for example). To return a sample irradiated with an FIB using Ga as an ion source to a process, the disclosed method removes a portion where Ga ions are implanted using an ion beam of a gas which does not seriously influence the characteristics of the sample or deposits an organic metal layer in such a way as to cover the Ga-implanted portion using a gaseous ion beam or an energy beam. That is, the publication discloses that after a process observation region is cleaned using one of argon (Ar), oxygen ion and oxygen radical and a compound is deposited there, the resultant sample is returned again to the fabrication process.

There is another proposition on the technology of processing a cross section with an Ar ion beam (see Japanese Patent Laid-Open Publication No. H7 (1995)-320670, for example). The publication discloses a scheme of processing a cross section for SEM observation using an Ar ion beam with a beam diameter of 0.1 μm generated from a helicon ion source. However, the publication discloses only a case where a target can be observed with the resolution of an SEM, but fails to give a consideration on TEM observation of a target which cannot be observed with the SEM.

The technique that does not generate defective products even by separating a sample for observation by a high-resolution electron microscope without segmenting a wafer and returning the wafer to the process without being contaminated with an element which would raise a problem in the process should still face the following problem.

First, the prior art techniques available to extract a TEM micro sample without segmenting a wafer are limited to schemes which use Ga ions, including the aforementioned micro-sampling method, pickup method and lift-out method. Therefore, studies are made on schemes which cope with Ga contamination. Of the conventional methods adapted to Ga contamination, the one which removes a Ga-implanted portion has to irradiate Ar ions on a wide region because Ga scatters widely, making the Ga contaminated region wider than the process region.

To completely eliminate Ga, Ar ions should be sputtered deeper than the process depth. This brings about problems that it takes time to cope with a process mark, made by the Ar ions, so that the mark does not raise a problem in the later process, and an extra cleaning step required after FIB processing would increase the manufacturing cost.

In the method of depositing an organic metal layer in such a way as to cover the Ga-implanted portion using a gaseous ion beam or an energy beam, the metal layer itself becomes a process contamination or the thickness of the metal layer makes the thickness of a sample at the peripheral portion different from the thickness of the other portion. This is likely to adversely affect the later process.

The conventional method of processing a cross section for SEM observation using an Ar ion beam with a beam diameter of 0.1 μm does not take, into consideration, TEM observation which cannot be observed with an SEM from the beginning. Like the conventional use of a GaFIB, the scheme forms a fine ion beam with a beam diameter of 0.1 μm and process a flat cross section perpendicular to the top surface. However, the luminance of the ion source that generates gaseous element ions, such as Ar, is lower by at least two digits to three digits than the luminance of a liquid metal ion source which is used to form a GaFIB. The formation of an ion beam with a beam diameter of 0.1 μm actually makes extremely difficult to achieve the desired level of 100 pA. If such a level is achieved, no way to keep the performance during the time practically needed has been achieved yet. Actually, the current obtained when the beam diameter is set to 0.1 μm merely has several pA so that the scheme has not made into a practical use.

That is, if the beam diameter of an Ai ion beam is made smaller to the size of a GaFIB, the current becomes small and the acceleration speed is too low, so that it is a common sense to those skilled in the art that an Ar ion beam is not usable. While wafer contamination by Ga ions is a well-known problem, there has been proposed no idea to prepare a TEM sample using Ar ions.

SUMMARY OF THE INVENTION

Accordingly, it is an object of the invention to provide a sample process method, an ion beam process apparatus, and an ion beam process system, which can perform intermediate inspection without segmenting a sample, such as a wafer, to improve the yield of semiconductor devices or so and separates a micro sample for analysis or prepares for separation of a micro sample for analysis from a sample without causing the sample to be contaminated with an element, such as Ga, which would be critical in the process, and a method of manufacturing electronics using them.

To achieve the object, according to the invention, a part of a sample is processed into a specimen using a first ion beam containing at least one of an inert gas, oxygen and nitrogen as an element until a micro sample is extracted from the wafer. This prevents the wafer from being contaminated with Ga. Unlike a thin ion beam with a beam diameter of 0.1 μm as used in the prior art, an ion beam with a relatively large beam diameter which provides a current of several nanoamperes is used. If the desired current is obtainable, a thin ion beam may be used. The step of processing the extracted specimen into a sample for TEM is carried out by another ion beam irradiation system using a second fine ion beam (e.g., a GaFIB). Accordingly, a TEM sample can be acquired without contaminating the wafer with Ga.

DETAILED DESCRIPTION OF THE PREFERRED EMBODIMENTS

Preferred embodiments of the invention will be described below with reference to the accompanying drawings.

Embodiments of a sample process method and an ion beam process apparatus, which separate a sample or prepare for separation of a sample are a method of separating or preparing a part of the substrate surface of a sample after a certain process, and an ion beam process apparatus which realizes the method. An embodiment of an ion beam process system according to the invention is a method of separating a part of the substrate surface of a sample with two ion beam process apparatuses and a system which accomplishes the method. An embodiment of a method of manufacturing electronics according to the invention is a method which inspecting and analyzing the process progress in the fabrication process on a part of a sample including the substrate surface and returning the substrate to the fabrication process to fabricate a circuit pattern.

Figure 1:
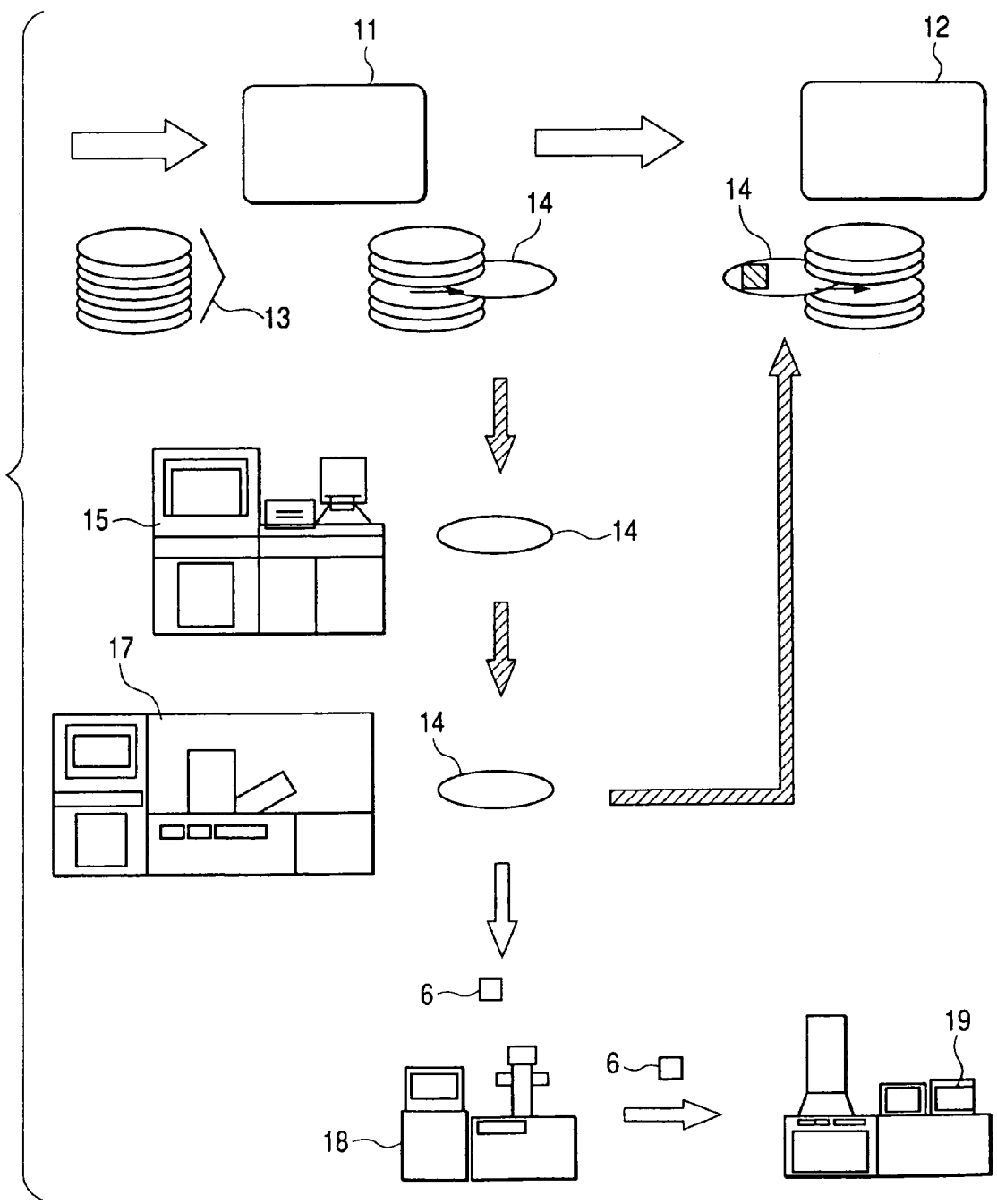
FIG. 1 is a diagram illustrating the flow of a wafer in a process in an electronics fabricating process according to the invention.
Figure 2A:
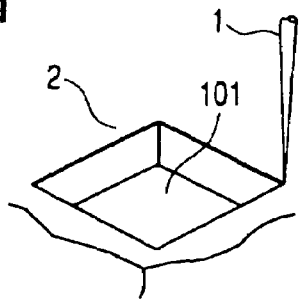
FIG. 2 is a diagram illustrating the flow of separating a micro sample from a conventional sample.
Figure 2B:
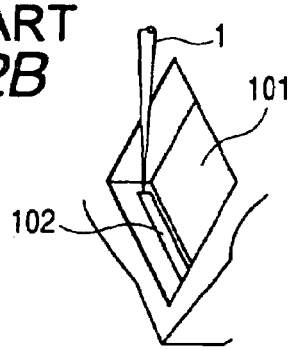
Figure 2C:
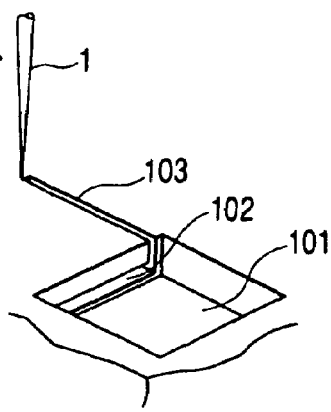
Figure 2D:
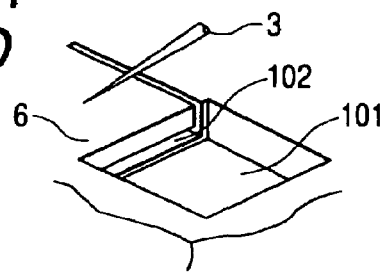
Figure 2E:
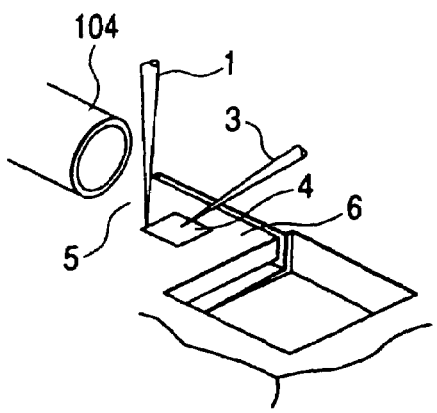
Figure 2F:
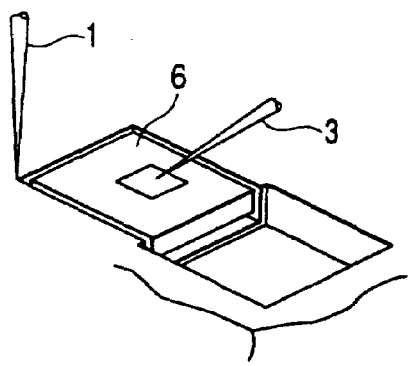
Figure 2G:
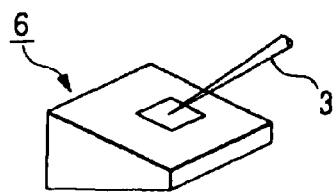

Referring to FIG. 1, a description will now be given of the fundamental flow (flow of a wafer) in the electronics manufacture process, including the sample process method for separating a sample or preparing for separation of a sample according to the invention and an inspection/analysis method using an ion beam process apparatus or a system according to the invention.

First, a lot 13 including a plurality of wafers is placed in an arbitrary N-th process 11. Those processes up to the N-th one include a step of forming a first layer on a wafer, for example. Next, a wafer 14 for inspection is selected from the wafers, and the remaining wafers stand by. The selected wafer 14 is supplied to an electron beam inspection system 15. When an abnormality is detected by the electron beam inspection system 15, the position is recorded as an address and its information is sent to a focused ion beam wafer process system 17. The focused ion beam wafer process system 17 extracts a micro sample 6 including a region to be inspected from the wafer 14 by using an Ar (argon) ion beam, a probe attached to the distal end of a manipulator and a deposition layer or so prepared by a deposition gas W(CO) 6.

An extraction hole in the wafer 14 from which the micro sample 6 is extracted is buried with an oxide layer by deposition with an Ar ion beam. Then, the wafer 14 is put back to the lot 13 in standby mode, and is put to a next (N+1)-th process 12. In the (N+1)-th process 12, another second layer is formed on the wafer 14. The micro sample 6 removed from the wafer is sent to a focused ion beam system 18 which irradiates a GaFIB. Here, the micro sample 6 is made into a membrane with the GaFIB to be a sample for TEM observation. With a transmission electron microscope (TEM) 19, the detailed observation of the sample structure at the interface where a layer is formed or so and element analysis are carried out.

The big feature of the embodiment lies in that between the N-th process 11 and the (N+1)-th process 12, the micro sample 6 for analysis is extracted by the Ar ion beam, avoiding contamination of the wafer with Ga, and preparation of a TEM sample which is difficult to attain with an Ar ion beam is executed by another ion beam process apparatus using a GaFIB. Although a semiconductor device which includes a process region from which the micro sample 6 is extracted becomes invalid in a process at and after the N-th process 11 and does not becomes a product, the number of wafers does not decrease. That is, the number of wafers to undergo the N-th process 11 is the same as the number of wafers to undergo the (N+1)-th process 12, and semiconductor devices fabricated in other regions than the region where the micro sample 6 has been extracted contribute to the number of products if they are not defective products.

Figure 4:
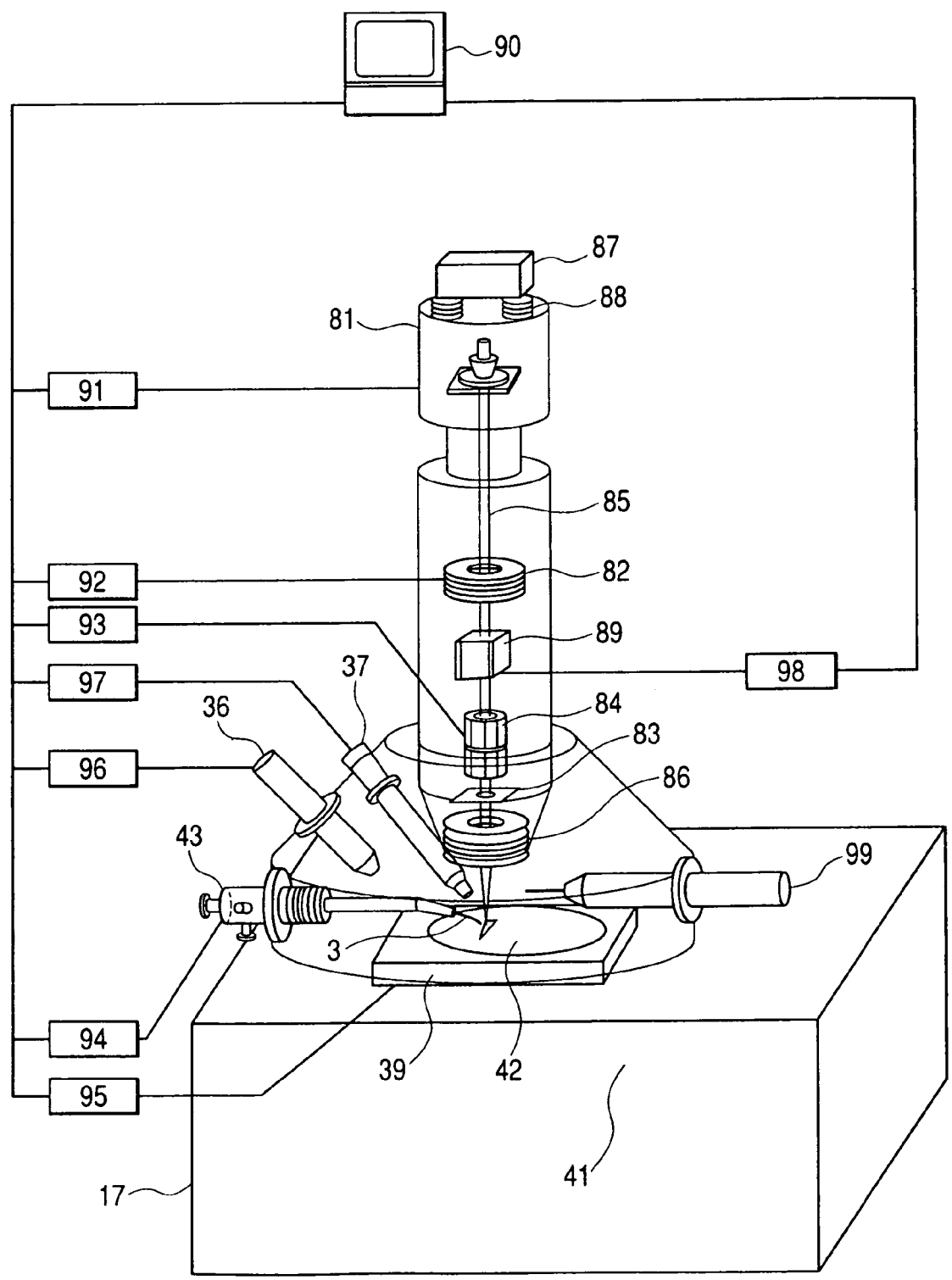
FIG. 4 is a diagram showing a focused ion beam wafer process system according to one embodiment of the invention.

An example of the structure of the focused ion beam wafer process system 17 (FIG. 1) is illustrated in FIG. 4.

The focused ion beam wafer process system 17 has a vacuum chamber 41 where an ion beam irradiation system, comprised of a duoplasmatron 81, a condenser lens 82, a beam limiting aperture 83, an ion beam scanning deflector 84 and an objective lens 86, is placed. The duoplasmatron 81 emits gas ions containing at least one of Ar, neon, xenon, krypton, oxygen, nitrogen and so forth as an element. Further, a probe 3, a secondary electron detector 36, a precursor gas dispenser 37, a sample stage 39, a sample carrier (not shown) on which a micro sample which is an extracted part of a sample 2, etc. are also laid out in the vacuum chamber 41. In addition, a controller 91 for duoplasmatron, a controller 92 for ion beam lens, a controller 93 for ion beam scanning, a manipulator controller 94 which controls a manipulator 43, a secondary particle detector 96, a controller 97 for the precursor gas dispenser, a controller 98 for mass spectrometer, a stage controller 95 and a central processing unit 90 are laid out in the vacuum chamber 41 as units that control the system 17.

Figure 5:
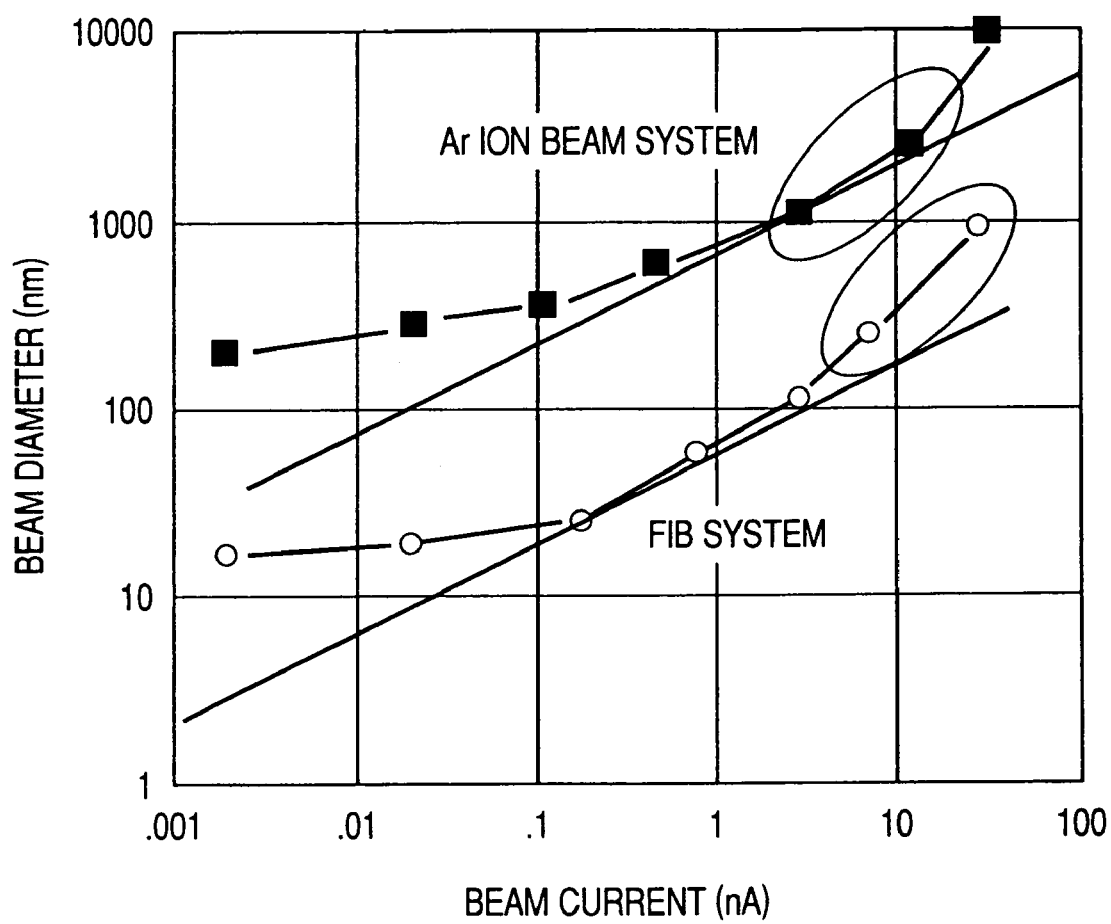
FIG. 5 is a diagram showing the ion current v.s. beam diameter characteristics of an ion beam irradiation system.

In the embodiment, an Ar gas is supplied to the duoplasmatron 81 to form an Ar ion beam. FIG. 5 shows the relationship between beam current and the beam diameter of the ion beam irradiation system. The acceleration voltage of an ion beam 85 is set to 30 kV. The aperture size that determines the size of the light source of the duoplasmatron 81 is set to 50 μm. Individual data points in FIG. 5 indicate property values corresponding to the diameters of the beam limiting aperture 83. FIG. 5 also shows the characteristics of the conventional GaFIB irradiation system. Straight lines in FIG. 5 represent the characteristics with a constant ion current density.

It is apparent from FIG. 5 that the conventional GaFIB maximizes the current density even with a beam diameter of several tens of nanometers. This is because the performance of the conventional FIB is demanded of a beam diameter range from nanometers to micrometers to ensure processing and fine observation. By way of contrast, the characteristics of the Ar ion beam is designed to maximize the current density at several micrometers which are suitable for extraction of a micro sample from a wafer. The beam diameter on a sample is determined by the size that is determined by the magnification at the time of focusing the size of the light source on the sample by a lens system and the defocus amount of the beam that is determined by the spherical aberration or chromatic aberration of the lens.

The conventional FIB irradiation system forms a beam with a beam diameter of sub micrometers so that the beam is used to extract a micro sample with an FIB. Accordingly, the lens magnification is set to an equal magnification and the aperture size is increased to obtain a beam current of several nanoamperes or greater. This however increases the amount of aberration-originated defocusing and the beam diameter on a sample is larger than the light source size of approximately 50 nm. If a duoplasmatron is mounted on the irradiation system, the diameter of the ion beam on a sample becomes at least several tens of micrometers due to the light source size of 50 µm, disabling extraction of a micro sample at all.

In this respect, the lens magnification is considerably reduced by 1/10 or smaller and the distance between the distal end of the objective lens and a sample is set to 10 mm or shorter in order to reduce the lens aberration further. The beam diameter is optimized to several micrometers by the beam diameter on a sample becomes smaller than at least the light source size by controlling the conditions for usage of the lens. Those measures can provide the beam performance that permits extraction of a micro sample. While the ion irradiation system according to the embodiment provides a beam diameter ranging from approximately 0.2 µm to 10 µm, the characteristics encircled by ovals in FIG. 5 are particularly suitable extraction of a micro sample for the process time can be shorted to several tens of minutes.

We discovered that at the time of cooling the duoplasmatron in the embodiment, the vibration of the fan of a cooling mechanism 87 would interfere with the proper formation of such a fine beam. To prevent the interference, a damper 88 is provided between the duoplasmatron and the cooling mechanism 87.

While cleaning with an Ar ion beam has been considered, not consideration has been made on a mass spectrometer for the ion beam at the time of returning a wafer to the process line. As it is found that iron ions or chromium ions are slightly mixed in an ion beam emitted from a duoplasmatron and are a probable cause for contaminating a wafer, resulting in defective semiconductor devices. In the embodiment, therefore, to prevent the ion mixture, the ion beam irradiation system is provided with a mass spectrometer 89 so that only the Ar ion beam reaches a sample.

The processing operation of fabricating a micro sample using an Ar ion beam, unlike the one in the prior art, should take the relatively large ion beam diameter into consideration. That is, it is difficult to execute micro processing using an ion beam with a beam diameter of 0.1 µm like that of the conventional FIB and it is necessary to fabricate a micro sample in a rough process.

Figure 6:
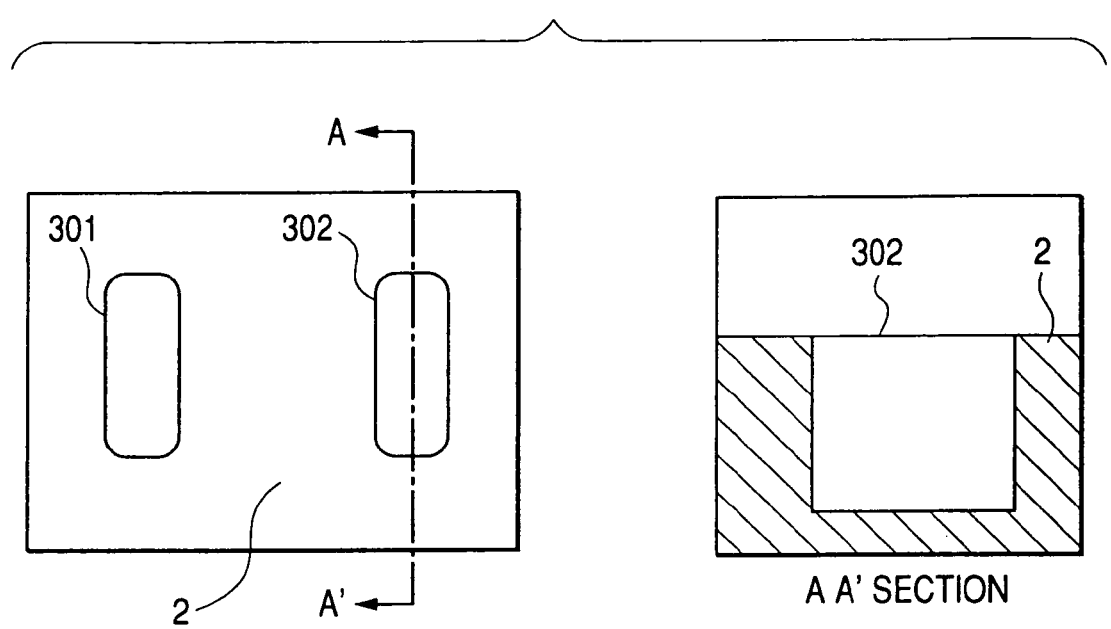
FIG. 6 is an exemplary diagram for explaining a process (a) in a method of separating a micro sample according to the invention.
Figure 7:
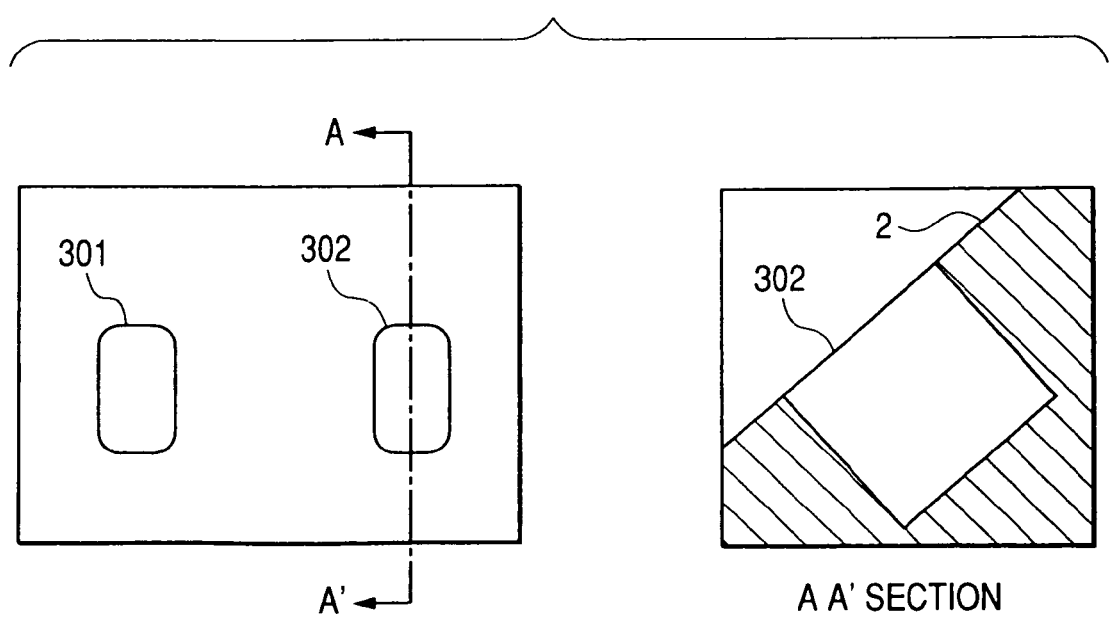
FIG. 7 is an exemplary diagram for explaining a process (b) in the method of separating a micro sample according to the invention.
Figure 8:
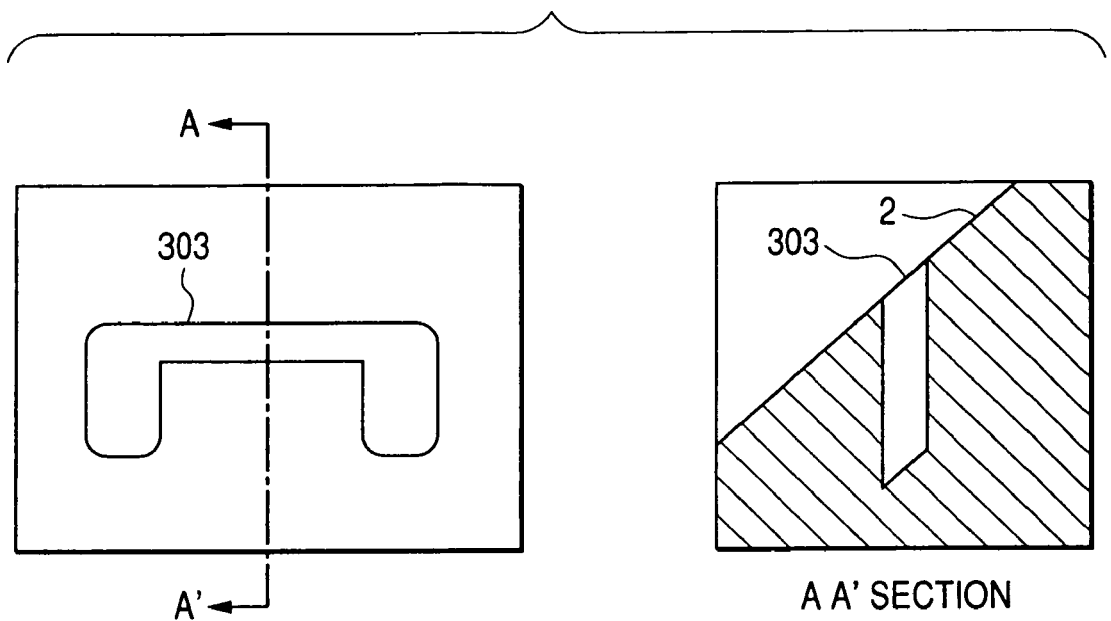
FIG. 8 is an exemplary diagram for explaining a process (c) in the method of separating a micro sample according to the invention.
Figure 9:
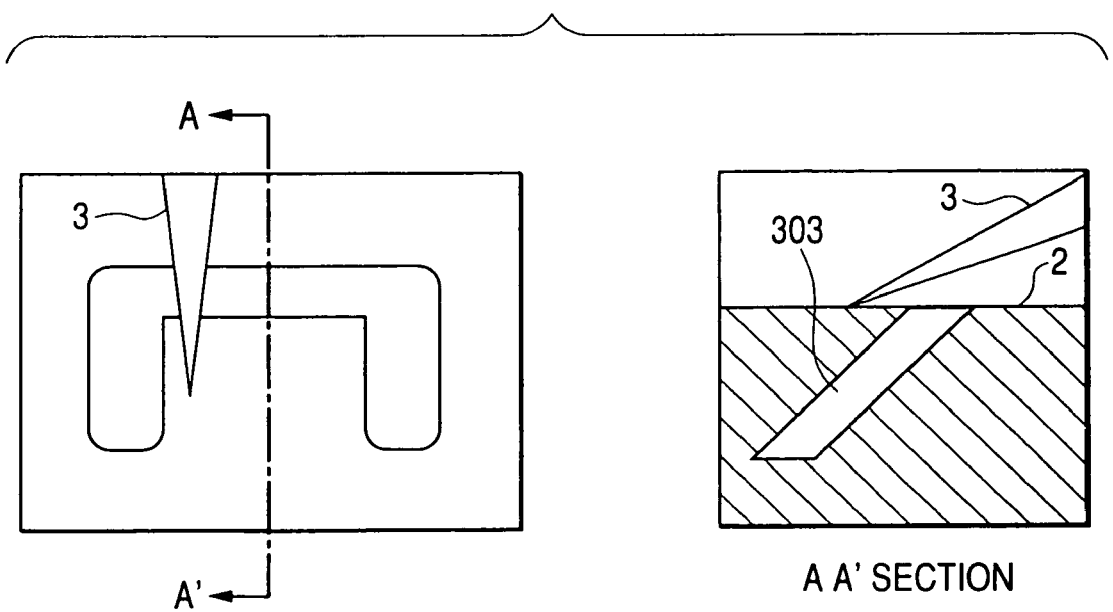
FIG. 9 is an exemplary diagram for explaining a process (d) in the method of separating a micro sample according to the invention.
Figure 10:
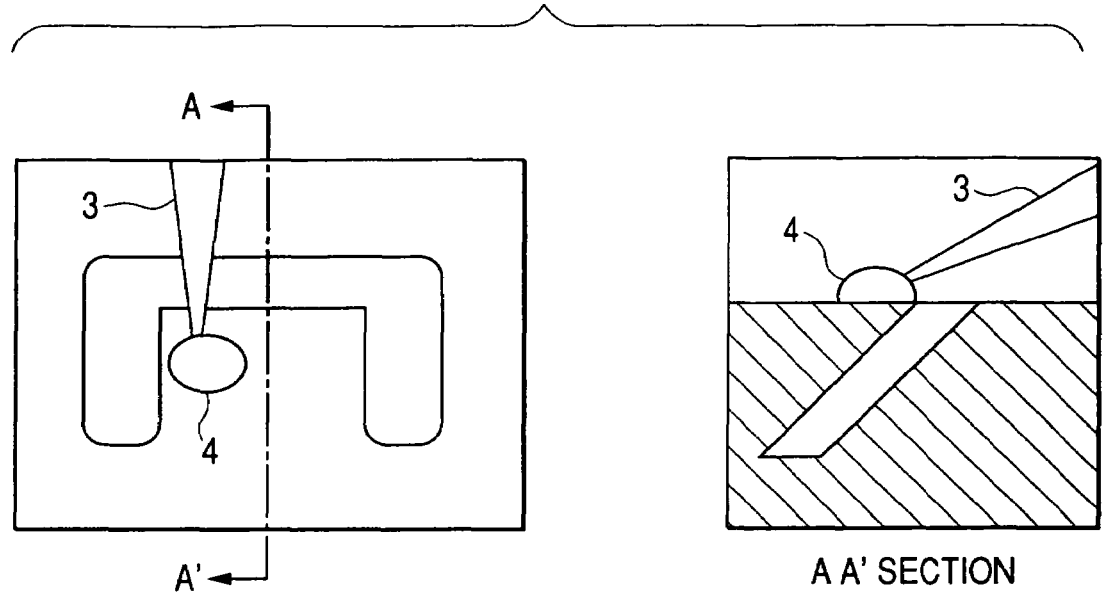
FIG. 10 is an exemplary diagram for explaining a process (e) in the method of separating a micro sample according to the invention.

This method, as shown in FIG. 6, irradiates an Ar ion beam to form rectangular holes 301 and 302 in the sample 2 on both sides of a target position first (step (a)). Those holes have a size of about 4×10 µm and are approximately 10 µm in depth. As exemplarily shown in the diagram, the corners of the rectangular hole becomes round due to the large beam diameter of about 3 µm. Then, as shown in FIG. 7, the sample stage is tilted (step (b)). Next, as shown in FIG. 8, the Ar ion beam is irradiated on the surface of the sample obliquely, thereby forming an oblique trench 303 (step (c)). The oblique trench has a size of approximately 20×40 µm and is approximately 12 µm deep. Next, as shown in FIG. 9, the sample stage is set back horizontally and the probe 3 is controlled by the probe controller to contact a part of the micro sample 6 (step (d)). Then, as shown in FIG. 10, the probe 3 and the micro sample 6 in contact with each other are fixed by using the deposition layer 4 (step (e)).

Figure 11:
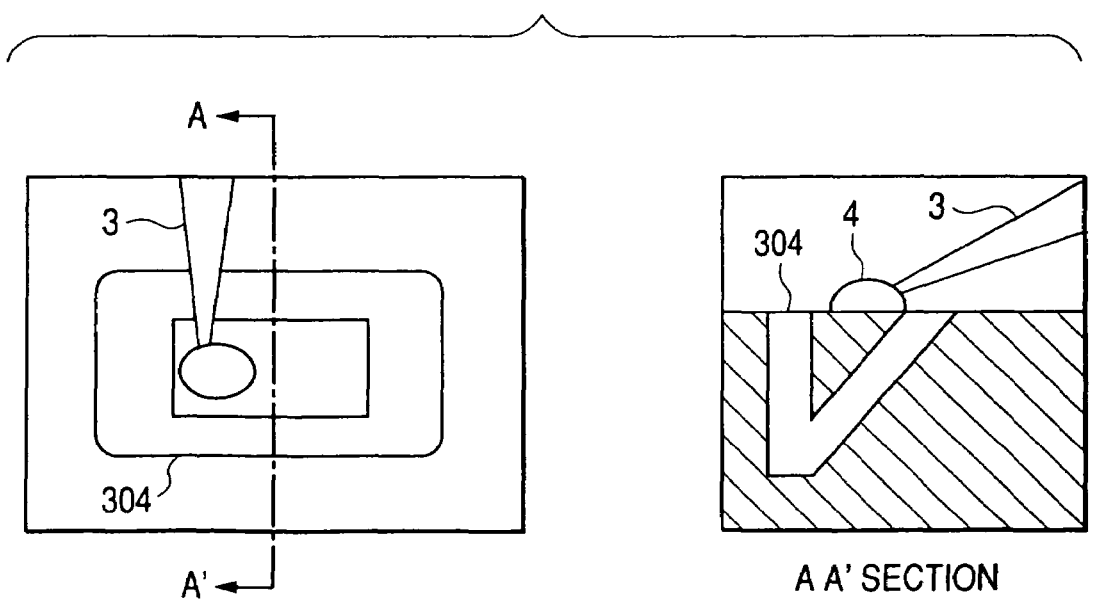
FIG. 11 is an exemplary diagram for explaining a process (f) in the method of separating a micro sample according to the invention.
Figure 12:
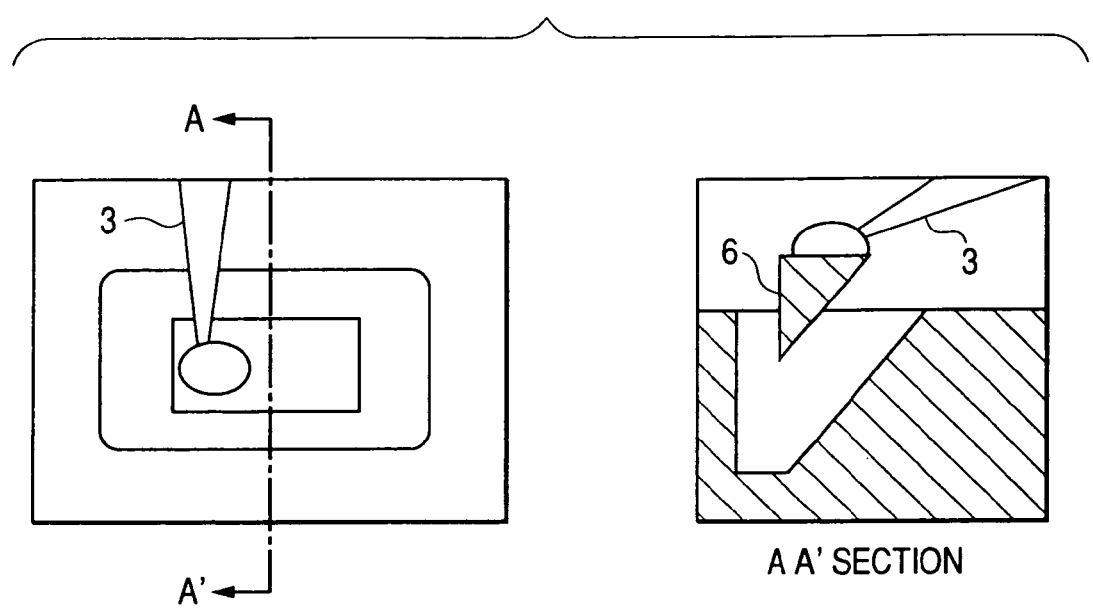
FIG. 12 is an exemplary diagram for explaining a process (g) in the method of separating a micro sample according to the invention.
Figure 13:
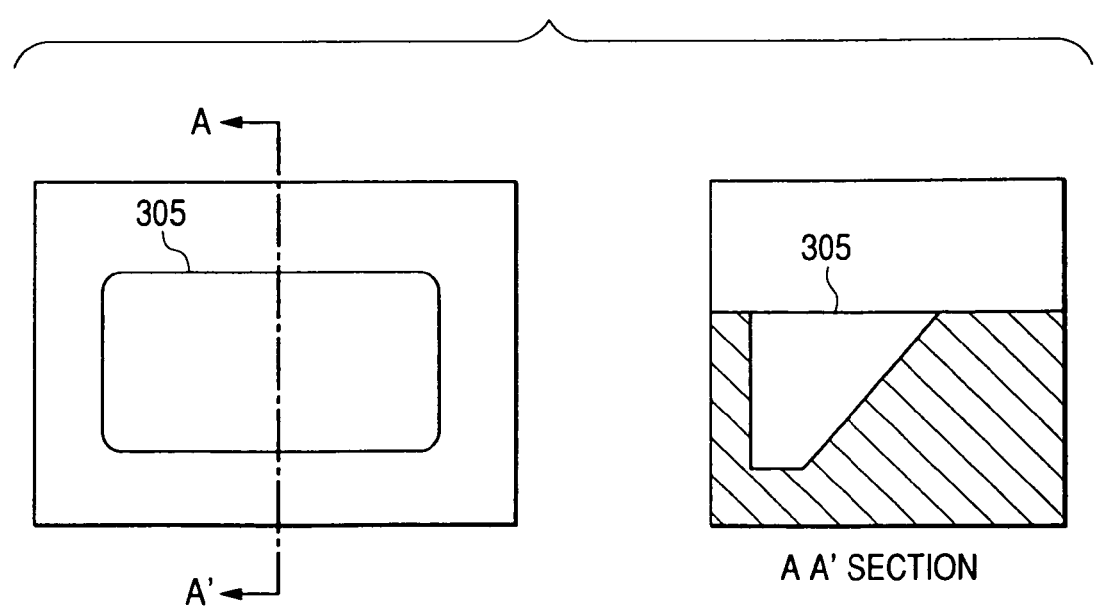
FIG. 13 is an exemplary diagram for explaining a process (h) in the method of separating a micro sample according to the invention.

Next, as shown in FIG. 11, a rectangular hole 304 is formed in the sample 2 so that the micro sample 6 is cut away from the wafer (step (f)). Next, as shown in FIG. 12, the probe 3 is moved upward by the probe drive unit (step (g)). After extraction of the micro sample 6, a processed hole 305 remains in the wafer as shown in FIG. 13 (step (h)).

Figure 14:
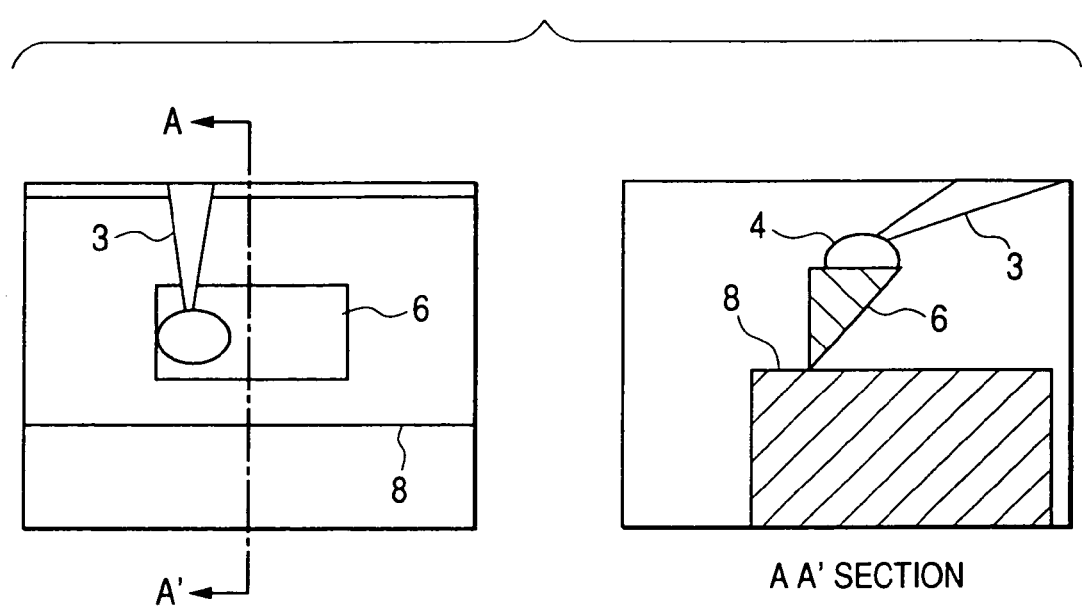
FIG. 14 is an exemplary diagram for explaining a process (i) in the method of separating a micro sample according to the invention.
Figure 15:
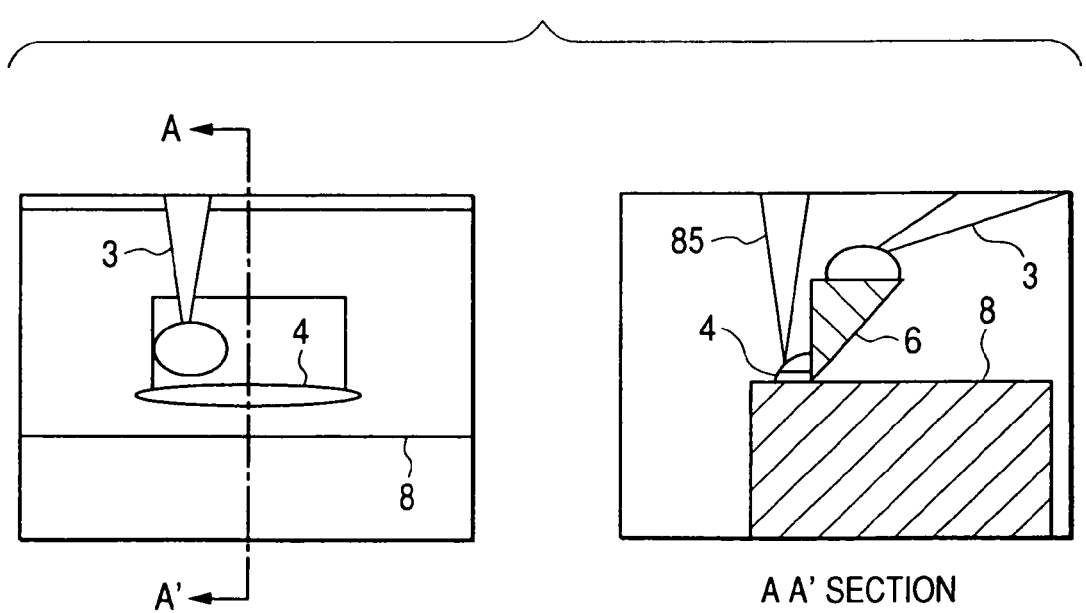
FIG. 15 is an exemplary diagram for explaining a process (j) in the method of separating a micro sample according to the invention.
Figure 16:
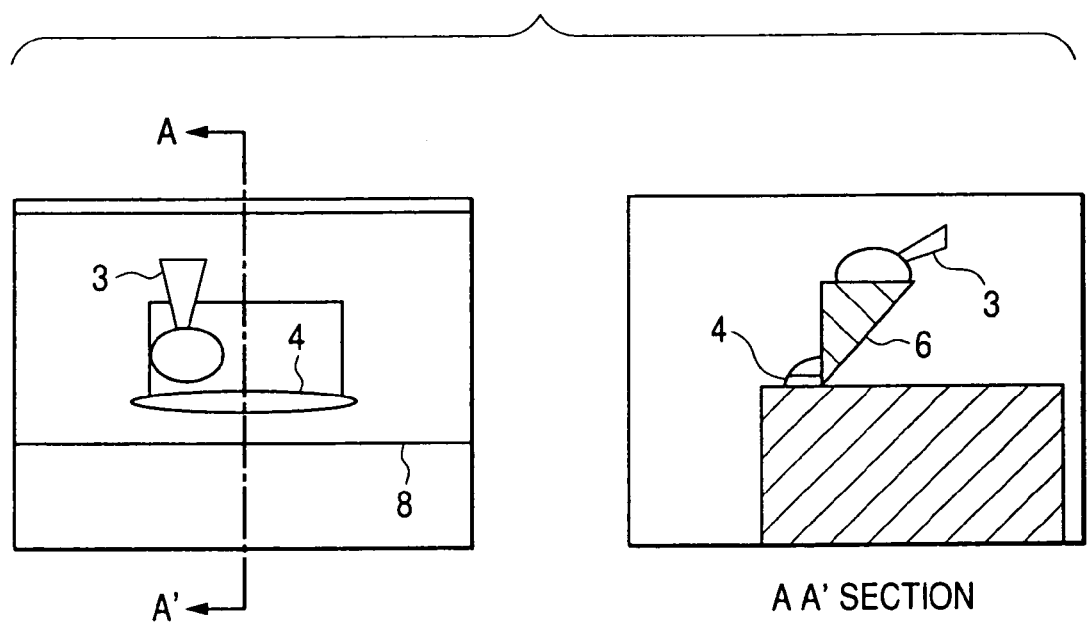
FIG. 16 is an exemplary diagram for explaining a process (k) in the method of separating a micro sample according to the invention.

Next, as shown in FIG. 14, the cut-away micro sample 6 is set in contact with the sample carrier 8 (step (i)). With the contact made, both the micro sample 6 and the sample carrier 8 are secured by using the deposition layer 4 as shown in FIG. 15 (step (j)). After fixation, as shown in FIG. 16, the Ar ion beam 85 is irradiated onto the connecting portion of the probe 3 to perform sputtering, then the probe 3 is separated from the micro sample 6 (step (k)). Note that the right-hand figures in FIGS. 6 to 16 are A-A' cross-sectional views of those illustrated on the left-hand figures therein.

The micro sample 6 is held mounted on the sample carrier 8. The focused ion beam wafer process system 17 is equipped with a sample stage 99 for micro sample which is a second sample stage, on which the sample carrier 8 mounted. While being mounted on the micro-sample stage 99, the sample carrier 8 is transferred to the focused ion beam system 18, which irradiates a GaFIB, through the opening of the casing of the focused ion beam wafer process system 17. The distal end of the micro-sample stage 99 is detachable so that only the distal end may be led into the focused ion beam wafer process system 17 and placed on the sample stage.

Figure 17:
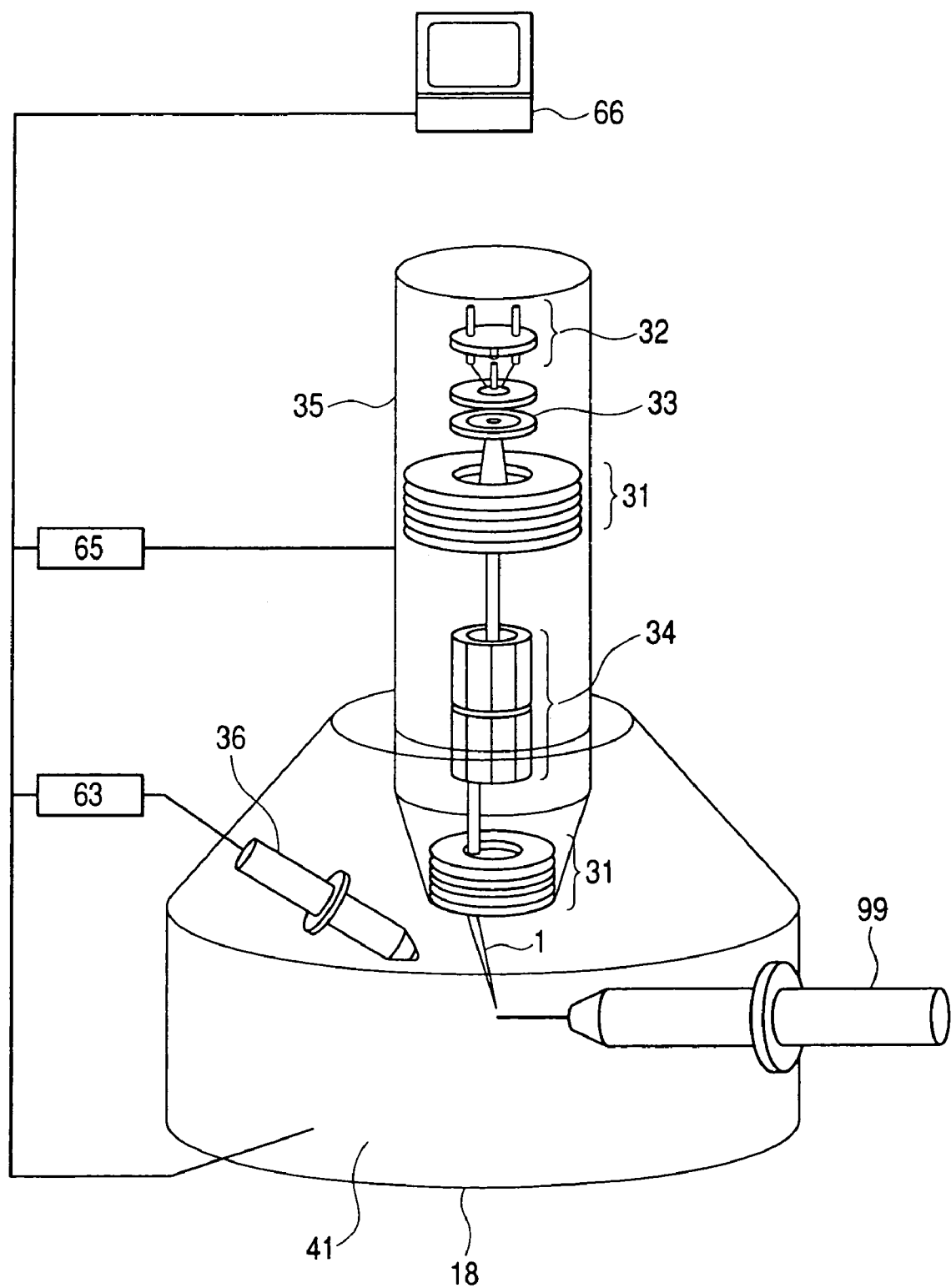
FIG. 17 is a diagram showing an ion beam process system to be used in one embodiment of the invention.

Next, the structure and the operation of the focused ion beam system 18 (FIG. 1) will be explained referring to FIG. 17.

The focused ion beam system 18 has the vacuum chamber 41 where an FIB irradiating optical system 35, comprised of a liquid metal ion source 32, which emits Ga, a beam limiting aperture 33, an ion beam scanning electrode 34 and ion beam lenses 31, the secondary electron detector 36, which detects the secondary electrons or secondary ions emitted from a sample upon FIB irradiation, are laid out. A secondary particle detector 63, an FIB controller 65, an FIB central processing unit 66, etc. are further located. The micro-sample stage 99 serves as a sample stage.

Next, the operation of the focused ion beam system 18 will be discussed. First, ions emitted from the liquid metal ion source 32 are irradiated on a sample wafer 38 through the beam limiting aperture 33 and the ion beam lenses 31. The FIB 1 is converged on the sample to a size ranging from approximately 0.05 to 0.2 µm.

Figure 18:
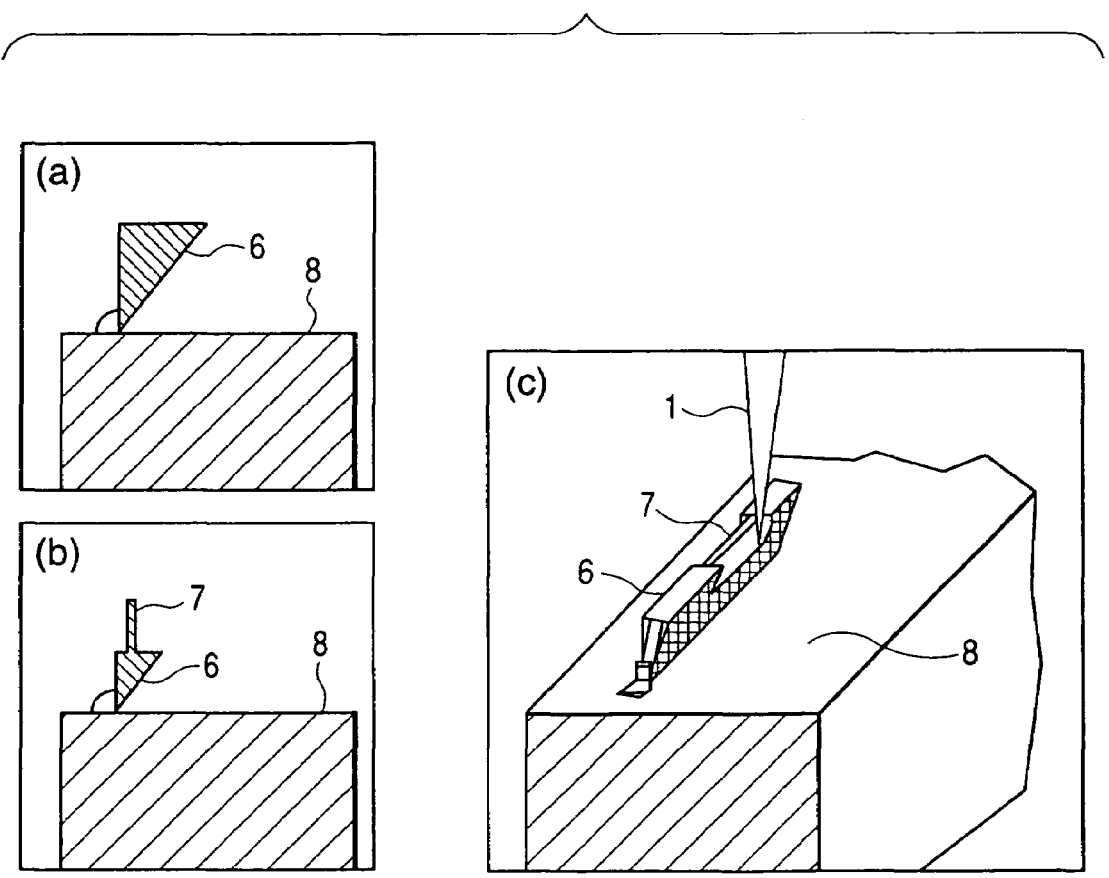
FIG. 18 is an exemplary diagram for explaining a method of preparing a sample for TEM after separation of a micro sample according to the invention.

FIG. 8 shows how a TEM sample is prepared. The analysis region of the micro sample 6 is processed into a membrane from (a) to (b) in FIG. 18. Note that (c) in FIG. 18 is a bird's-eye view of (b). In the process, a beam of 0.2 µm in diameter is used first, then beams of narrower diameters are gradually used, and a final target, a membrane with a thickness of 100 nm, is formed with a beam of 0.05 µm. Such fine processing is difficult with the use of the focused ion beam wafer process system 17. In the invention, a TEM sample is prepared by the cooperation of the focused ion beam wafer process system 17 and the focused ion beam system 18.

The embodiment provides a method of separating a sample for analysis or preparing for separation of a sample for analysis from a wafer without contaminating the wafer with such an element which would raise a problem in the process, and provides a novel inspection/analysis method that does not waste wafers and does not produce defective products even when a wafer from which a sample is extracted for inspection is returned to the process.

The use of the method of manufacturing electronics according to the invention can ensure proper evaluation without segmenting a sample, such as a wafer, and does not produce additional defective products so that expensive wafers are not wasted. In addition, the production yield of electronics is improved. Further, the invention provides an ion beam process apparatus and ion beam process system which can achieve the sample process method, the inspection/analysis method and the electronics manufacturing method, which separate a sample for analysis or prepare for separation of a sample for analysis.

In the embodiment, process data (information) in the focused ion beam wafer process system 17 is transferred, on line, to the focused ion beam system 18 from the central processing unit 90 (FIG. 4) via the FIB central processing unit 66 to automatically perform FIB processing, thereby significantly improving the working efficiency. This is because process data for fine processing becomes complicated in the embodiment so that it is important to automatically analyze process data for extraction of a micro sample and make settings for processing membranes to carry out the fine processing without failure. The focused ion beam wafer process system 17 can identify a wafer loaded into the system by a number engraved on the surface through image recognition and transfer information on the identification, on line, to the focused ion beam system 18 from the central processing unit 90 via the FIB central processing unit 66. Accordingly, the identification information corresponding to specimens transferred to the focused ion beam system 18 can be managed, so that the analysis results can be reflected on wafers accurately.

The focused ion beam wafer process system 17 and the focused ion beam system 18 may be integrated. In this case, the focused ion beam wafer process system 17 has an opening for feeding a sample to the focused ion beam system 18. The opening is coupled to the sample carrier conveying apparatus. Therefore, a micro sample is transferred to the focused ion beam system 18 via the conveying apparatus while being mounted on the sample carrier.

Although the Ar ion beam irradiation system and the FIB ion beam irradiation system are provided in different apparatus in the embodiment, both system may be provided in the same apparatus. In this case, after extraction of a micro sample with an Ar ion beam is completed, a wafer should be removed from the apparatus to avoid Ga contamination or some measures should be taken to prevent Ga-scattering oriented contamination. In this case, the cost for the apparatus can be reduced significantly, though lower the throughput of preparation of TEM samples becomes.

Figure 3A:
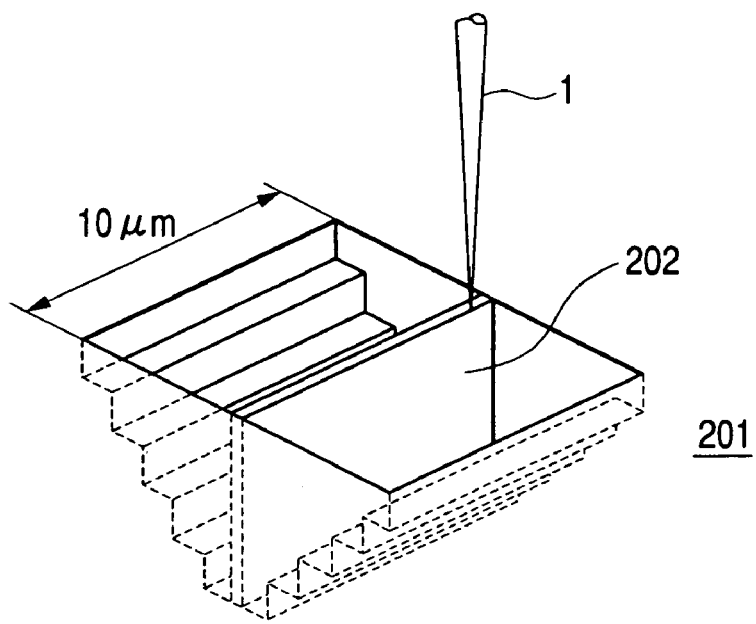
FIG. 3 is a diagram for explaining a method of separating a micro sample from a conventional sample.
Figure 3B:
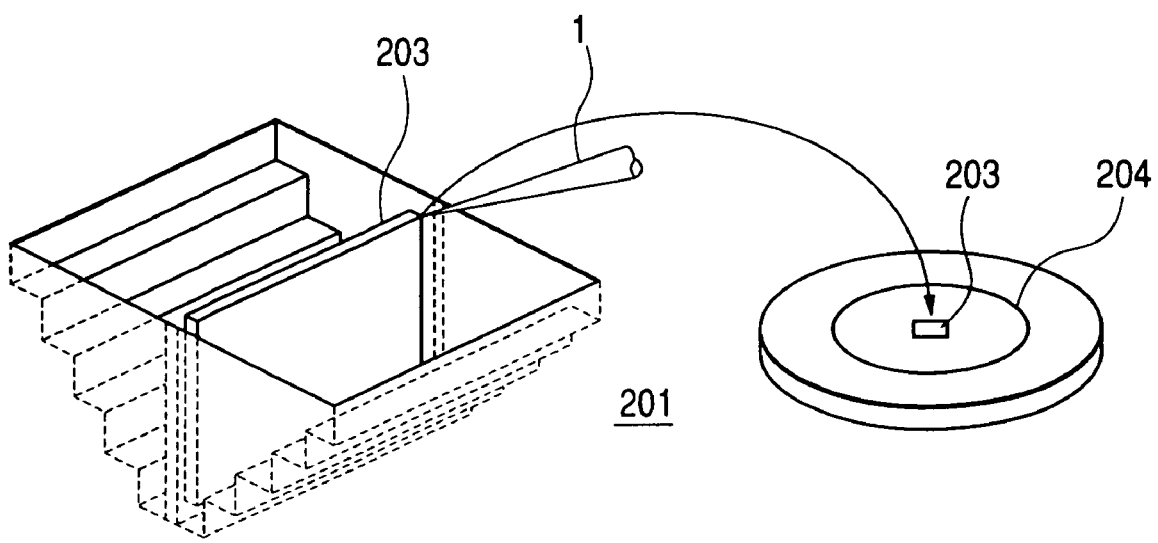

The foregoing description of the embodiment has been given of an example where a method of acquiring a micro sample with the focused ion beam wafer process system is employed. As shown in FIG. 3, however, the focused ion beam wafer process system may prepare for separation of a sample, a wafer may be taken out of the focused ion beam wafer process system and the micro sample may be separated and extracted by another mechanism. For example, a micro sample is extracted by using static electricity generated from a glass rod in the air. Apparently, the invention covers a method, apparatus and system which process a micro sample and prepares for separation of the micro sample without separating the micro sample inside the apparatus by processing most of the outside shape of the micro sample with an ion beam.

Further, as apparent from the above, the invention covers not only the focused ion beam wafer process system utilized for extracting a micro sample to be analyzed from a wafer, but also a focused ion beam wafer process system including an electron beam irradiation system which is utilized for observing inside a target device, such as a cross section, and analyzing the device with an electron beam emitted from the electron beam irradiation system.

In the embodiment, the beam diameter is used to represent an ion beam size. This is the case where the beam shape is nearly circular and the beam profile is given as shown in FIG. 9. In the embodiment, the beam diameter is the beam width at the position where the beam profile intensity is about 37%, as shown in FIG. 9. The shape of the beam is not limited to a circular beam but an oval beam or an approximately rectangular beam can also be used to achieve the object of the invention if the maximum beam size is set to approximately 0.2 to 10 μm by controlling the lenses in such a way that the beam size becomes smaller than the size of the light source.

Although the Ar ion beam is focused into a spot in the embodiment, the invention can also be adapted to a case where a mask having a hole with a certain shape is inserted in the path of the ion beam irradiation system and a patterning beam which has the shape of the mask projected on a sample is used.

Figure 21:
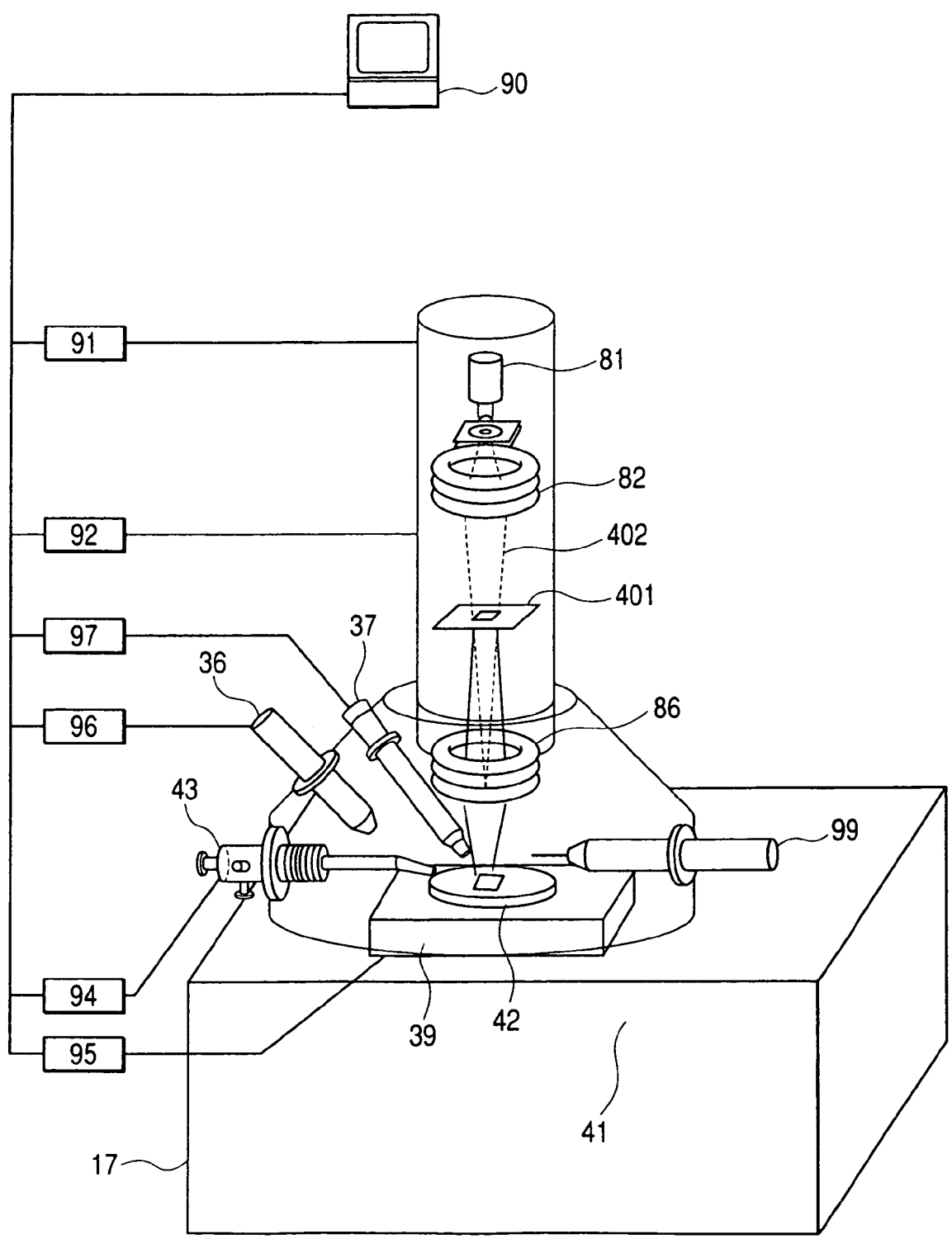
FIG. 21 is a diagram showing another example of the focused ion beam wafer process system according to the invention.

FIG. 21 is a schematic diagram showing a system structure in this example. The ion beam process apparatus has a vacuum chamber 41 where an ion beam irradiation system, comprised of a duoplasmatron 81, a condenser lens 82, a stencil mask 401, an objective lens 86, etc., is provided. The duoplasmatron 81 emits gas ions containing at least one of Ar, neon, xenon, krypton, oxygen, nitrogen and so forth as an element. Further, a probe 3, a secondary electron detector 36, a precursor gas dispenser 37, a sample stage 39, a sample carrier (not shown) on which a micro sample which is an extracted part of a sample 2, etc. are also laid out in the vacuum chamber 41. In addition, a controller 91 for duoplasmatron, a controller 92 for ion beam lens, a manipulator controller 94 which controls a manipulator 43, an amplifier 96 for the secondary electron detector, a controller 97 for the precursor gas dispenser, a controller 98 for mass spectrometer, a stage controller 95 and a central processing unit 74 are laid out in the vacuum chamber 41 as units that control the system 17.

In the example, an Ar gas is supplied to the duoplasmatron 81 to form an Ar ion beam. First, an ion beam 402 is focused near the center of the objective lens 86 by the condenser lens 82. The ion beam passes through the stencil mask 401 having a rectangular hole. The objective lens 86 is controlled under the conditions where the stencil mask 401 is projected on the sample. Then, a rectangular patterning ion beam is irradiated on the sample, forming a rectangular hole. The rectangular hole is used in the processes shown in FIGS. 6 to 16 to process the sample and separate a micro sample or prepare for separation of the micro sample. The acceleration voltage of the ion beam is set to 40 kV. The aperture size that determines the size of the light source of the duoplasmatron 81 is set to 50 μm.

Figure 19:
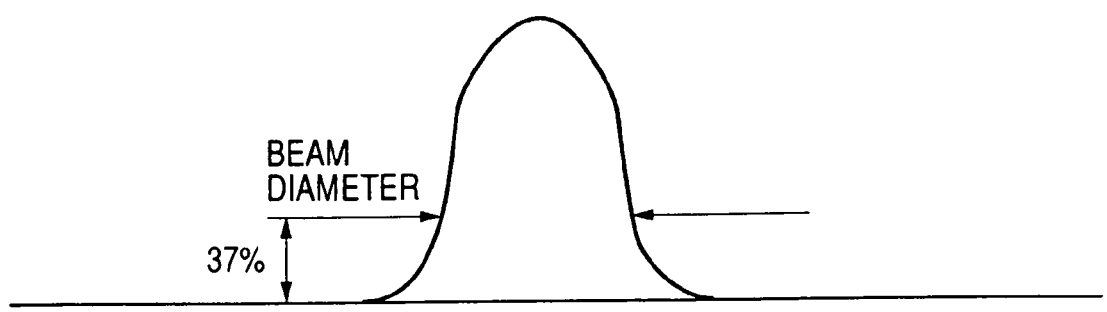
FIG. 19 is an exemplary diagram showing the intensity profile of an argon ion beam according to the invention.
Figure 20:
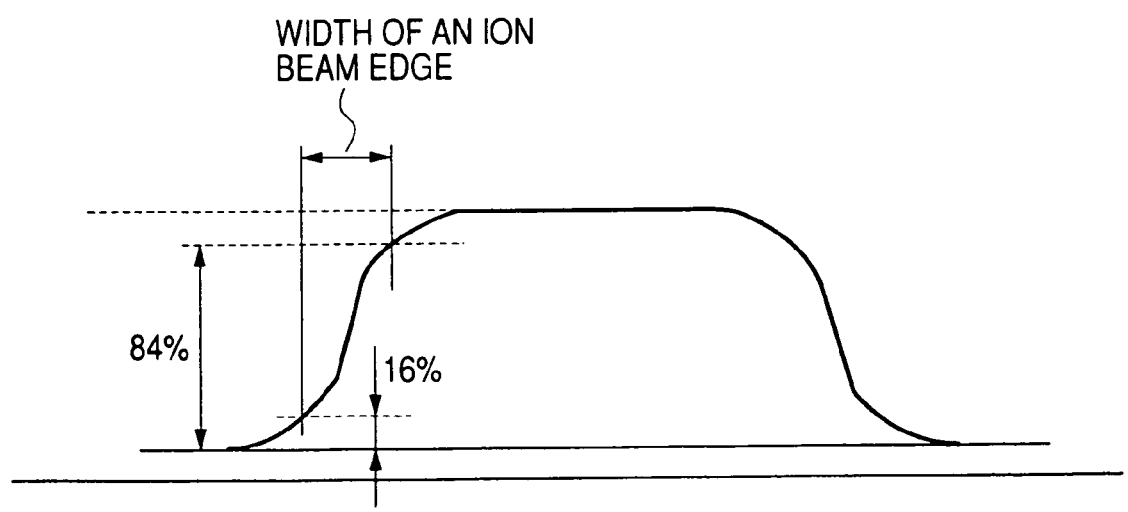
FIG. 20 is an exemplary diagram showing the intensity profile of an argon ion beam (patterning ion beam) according to the invention.

In an embodiment in which a shape of an ion beam spot is not circular, the ion beam diameter can't be determined based on the way shown in FIG. 19. However, in an ion beam profile shown in FIG. 20, by substituting a distance between two points at which an intensity of the ion beam changes from 16% to 84% of peak intensity in a width of an ion beam edge (a region including an edge of the ion beam diameter) for the determination in a manner shown in FIG. 19, the diameter of the ion beam can be determined . Then, the ion beam irradiation system has only to be constructed in such a way as to make the beam diameter smaller than the light source size, thereby ensuring extraction of a micro sample.

Although the Ar ion beam is used in the embodiment, it is apparent that an ion beam containing another element, such as oxygen, nitrogen, neon, xenon or krypton, and a mixture thereof can bring about similar effects.

As described above, the invention realizes a method which separates a sample for analysis or prepares for separation of a sample for analysis without contaminating a sample, such as a wafer, with such an element which raises a problem in the process, and a novel inspection/analysis method that does not waste wafers and does not produce defective products even when a wafer from which a sample is extracted for inspection is returned to the process. The use of the method of manufacturing electronics according to the invention can ensure proper evaluation without segmenting a sample, such as a wafer, and does not produce additional defective products so that expensive wafers are not wasted. In addition, the production yield of electronics is improved. Further, the invention provides an ion beam process apparatus which can achieve the sample process method, the inspection/analysis method and the electronics manufacturing method, which separate a sample for analysis or prepare for separation of a sample for analysis.

The following will discuss the typified structural examples of the invention and the effects they bring about.

(1) A method of processing a sample by using an ion beam according to the invention is characterized by including the steps of fabricating a specimen from a part of a sample by using a first ion beam containing at least one of an inert gas, oxygen and nitrogen as an element; separating the fabricated specimen from the sample; and processing the separated specimen by using a second ion beam different from the first ion beam.

Accordingly, the invention provides a sample process method which separates a sample for analysis or prepares for separation of a sample for analysis without contaminating a sample, such as a wafer, with an element, such as Ga, which raises a problem in the process.

(2) A method of processing a sample by using an ion beam according to the invention is characterized by including the steps of generating a first ion beam, which contains at least one of an inert gas, oxygen and nitrogen as an element, from a first ion source in a first ion beam process apparatus; fabricating a specimen from a part of a sample by using the generated first ion beam; separating the specimen from the sample by using the first ion beam; placing and holding the specimen on a sample stage; feeding the specimen held on the sample stage to a second ion beam process apparatus; generating a second ion beam, which contains an element other than the element of the first ion beam, from a second ion source in the second ion beam process apparatus; and processing the specimen into a sample for an electron microscope by using the generated second ion beam.

Accordingly, the method is used in a sample process which separates a sample for analysis or prepares for separation of a sample for analysis without contaminating a sample, such as a wafer, with an element, such as Ga, which raises a problem in the process. Particularly, the invention provides a method of processing a sample for an electron microscope by cooperative use of the first ion beam process apparatus and the second ion beam process apparatus.

(3) An ion beam process apparatus according to the invention is characterized by comprising an ion source; an optical system for converging and deflecting an ion beam emitted from the ion source; means for irradiating the ion beam on a sample and perform scanning with the ion beam to fabricate a specimen from a part of the sample; and a probe for separating the specimen fabricated by the ion beam from the sample, wherein the ion beam generated by the ion source contains at least one of an inert gas, oxygen and nitrogen as an element.

Accordingly, the invention provides an ion beam process apparatus to be used in a sample process method which separates a sample for analysis or prepares for separation of a sample for analysis without contaminating a sample, such as a wafer, with an element, such as Ga, which raises a problem in the process.

(4) An ion beam process apparatus according to the invention characterized by comprising an ion source; an optical system for patterning an ion beam, emitted from the ion source, via a patterning mask, and converging and deflecting the ion beam; means for scanning a sample with the patterned ion beam projected on the sample to fabricate a specimen from a part of the sample; and a probe for separating the specimen fabricated by the patterned ion beam from the sample, wherein the ion beam generated by the ion source contains at least one of an inert gas, oxygen and nitrogen as an element.

Accordingly, the invention provides an ion beam process apparatus that achieves a sample process method which separates a sample for analysis or prepares for separation of a sample for analysis without contaminating a sample, such as a wafer, with an element, such as Ga, which raises a problem in the process. Particularly, the invention provides an ion beam process apparatus suitable for fast specimen processing using a patterning beam.

(5) An ion beam process system according to the invention characterized by comprising a first ion beam process apparatus including a first ion source, an optical system for converging and deflecting a first ion beam emitted from the first ion source, means for irradiating the first ion beam on a sample and perform scanning with the first ion beam to fabricate a micro sample from a part of the sample, a probe for separating the micro sample fabricated by the first ion beam from the sample, and a micro-sample stage on which the micro sample is to be placed and held, wherein the first ion beam generated by the first ion source contains at least one of an inert gas, oxygen and nitrogen as an element; and a second ion beam process apparatus having a second ion source for generating a second ion beam containing an element different from the element of the first ion beam, wherein the separated micro sample is fed to the second ion beam process apparatus from the first ion beam process apparatus while being held on the micro-sample stage, and is processed by using the second ion beam.

Accordingly, the invention provides an ion beam process system that achieves a sample process method which separates a sample for analysis or prepares for separation of a sample for analysis without contaminating a sample, such as a wafer, with an element, such as Ga, which raises a problem in the process. Particularly, the invention provides an ion beam process system that can permit smooth cooperative use of the first ion beam process apparatus and the second ion beam process apparatus by using a micro-sample stage and can efficiently prepare a sample for an electron microscope.

The above structure is further provided with transfer means for transferring process information on the micro sample separated by the first ion beam process apparatus to the second ion beam process apparatus.

Accordingly, the invention provides an ion beam process system that achieves a sample process method which separates a sample for analysis or prepares for separation of a sample for analysis without contaminating a sample, such as a wafer, with an element, such as Ga, which raises a problem in the process. Particularly, the invention provides an ion beam process system that can ensure smooth cooperative use of the first ion beam process apparatus and the second ion beam process apparatus because of the transfer of process information on the micro sample, separated by the first ion beam process apparatus, to the second ion beam process apparatus, and can efficiently prepare a sample for an electron microscope with a high yield.

(6) A method of manufacturing electronics according to the invention is characterized by including the steps of fabricating a specimen from a part of a sample by using a first ion beam containing at least one of an inert gas, oxygen and nitrogen as an element for inspection of the sample, after an arbitrary step in a manufacturing process to form electronics by processing the sample; and separating the fabricated specimen from the sample, wherein the sample from which the specimen is separated is returned to a next step to the arbitrary step and the manufacturing process is resumed. The method may further include a step of processing the specimen into a sample for an electron microscope by using a second ion beam containing an element different from the element of the first ion beam, and wherein the specimen extracted from the sample is inspected and analyzed.

Accordingly, the invention provides a electronics manufacturing method that uses a sample process method, an ion beam process apparatus, and an ion beam process system, which can perform intermediate inspection without segmenting a sample, such as a wafer, to improve the yield of semiconductor devices or so and separates a micro sample for analysis or prepares for separation of a micro sample for analysis from a sample without causing the sample to be contaminated with an element, such as Ga, which would be critical in the process.

In any of the structural examples of the invention, the sample is one of a silicon semiconductor wafer, an epitaxial growth silicon wafer, a wafer having a silicon membrane formed on a substrate, a compound semiconductor wafer and a magnetic head integrated wafer.

In short, it is possible to realize a sample process method, an ion beam process apparatus, and an ion beam process system, which can perform intermediate inspection without segmenting a sample, such as a wafer, to improve the yield of semiconductor devices or so and separates a micro sample for analysis or prepares for separation of a micro sample for analysis from a sample without causing the sample to be contaminated with an element, such as Ga, which would be critical in the process, and an ion beam process apparatus and system which achieve the method.

What is claimed is:

1. A fabrication apparatus comprising:
an ion source for emitting an ion beam;
an optical system for irradiating a sample with a patterning ion beam formed by passing the ion beam emitted from the ion source through a patterning mask, to fabricate a specimen from a part of the sample;
a manipulator having a probe for separating said specimen fabricated by the irradiation of the patterning ion beam from said sample,
an electron beam irradiation system for irradiating an electron beam to said sample;
wherein said ion beam generated by said ion source contains at least one of an inert gas, oxygen and nitrogen as an element.

2. The fabrication apparatus according to claim 1, further comprising, a central control unit for controlling said optical system so that a beam diameter of said ion beam on a surface of said sample becomes equal to or smaller than a size of a light source.

3. The fabrication apparatus according to claim 1, further comprising, a mass spectrometer for removing impurities contained in said ion beam.

4. The fabrication apparatus according to claim 1, further comprising, a cooling mechanism for cooling said ion source.

5. The fabrication apparatus according to claim 1,
wherein said optical system contains an objective lens,
wherein the distance between said objective lens and said sample is 10 mm or shorter.

6. The fabrication apparatus according to claim 1,
wherein said ion source is duoplasmatron.

7. The fabrication apparatus according to claim 1,
wherein said sample after said specimen is separated is observed by said electron beam irradiation system.

8. A fabrication system comprising:
a first ion beam apparatus including
a first ion source for emitting a first ion beam;
a sample stage for mounting a first sample;
an optical system for irradiating a sample with a patterning ion beam, formed when the first ion beam is passed through a patterning mask, to fabricate a specimen from a part of said first sample;
a manipulator having a probe for separating said specimen fabricated by the irradiation of the patterning ion beam from said first sample;
a specimen stage on which said specimen is to be placed;
wherein said first ion beam generated by said first ion source contains at least one of an inert gas, oxygen and nitrogen as an element,
an electron beam irradiation system that irradiates an electron beam to said first sample after said specimen is separated,
a second ion beam process apparatus having a second ion source for generating a gallium ion beam,
wherein said separated specimen is fed to said second ion beam process apparatus from said first ion beam process apparatus while being held on said specimen stage, and is processed into a second sample for an electron microscope by using said gallium ion beam.

9. A fabrication system comprising:
a first ion beam apparatus including
a first ion source for emitting a first ion beam;
a sample stage for mounting a first sample;
an optical system for irradiating a sample with a patterning ion beam formed by passing the first ion beam emitted from the ion source through a patterning mask, to fabricate a specimen from a part of said first sample;
a manipulator having a probe for separating said specimen fabricated by the irradiation of the patterning ion beam from said first sample;
a specimen stage on which said specimen is to be placed;
wherein said first ion beam generated by said first ion source contains at least one of an inert gas, oxygen and nitrogen as an element,
an electron beam irradiation system for irradiating an electron beam to said sample,
a second ion beam process apparatus having a second ion source for generating a gallium ion beam, and
wherein said separated specimen is processed into a second sample for an electron microscope by using said gallium ion beam.

10. The fabrication system according to claim 9,
wherein said sample after said specimen is separated is observed by said electron beam irradiation system.

11. The fabrication system according to claim 9, further comprising,
a mass spectrometer for removing impurities contained in said first ion beam.

12. The fabrication system according to claim 9, wherein said optical system contains an objective lens, wherein the distance between said objective lens and said sample is 20 mm or shorter.

13. The fabrication system according to claim 9, wherein said ion source is duoplasmatron.

* * * * *